United States Patent
Hou

(10) Patent No.: US 11,004,917 B2
(45) Date of Patent: May 11, 2021

(54) PIXEL DEFINING LAYER, DISPLAY SUBSTRATE AND MANUFACTURING METHOD THEREOF, AND DISPLAY APPARATUS

(71) Applicant: BOE Technology Group Co., Ltd., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/030,930

(22) Filed: Jul. 10, 2018

(65) Prior Publication Data

US 2019/0096970 A1 Mar. 28, 2019

(30) Foreign Application Priority Data

Sep. 27, 2017 (CN) .......................... 201710889480.5

(51) Int. Cl.
*H01L 27/32* (2006.01)
*H01L 51/56* (2006.01)
*H01L 51/00* (2006.01)

(52) U.S. Cl.
CPC ...... *H01L 27/3246* (2013.01); *H01L 27/3211* (2013.01); *H01L 27/3216* (2013.01);
(Continued)

(58) Field of Classification Search
CPC ............. H01L 27/3246; H01L 27/3283; H01L 27/3216; H01L 27/3211–3218;
(Continued)

(56) References Cited

U.S. PATENT DOCUMENTS

2003/0222267 A1* 12/2003 Kim ..................... H01L 27/3246
257/98
2006/0220543 A1* 10/2006 Makiura ............. H01L 51/5088
313/506
(Continued)

FOREIGN PATENT DOCUMENTS

CN 102823325 A 12/2012
CN 105895818 A 8/2016
(Continued)

OTHER PUBLICATIONS

First office action of Chinese application No. 201710889480.5 dated Jun. 19, 2019.

*Primary Examiner* — Yu Chen
(74) *Attorney, Agent, or Firm* — Fay Sharpe LLP

(57) ABSTRACT

A pixel defining layer, a display substrate and manufacturing method thereof, and a display apparatus are provided. The pixel defining layer includes: a lyophilic material layer disposed on a base substrate, and a lyophobic material layer disposed at a side of the lyophilic material layer away from the base substrate. An orthographic projection of a surface of the lyophobic material layer close to the base substrate on the base substrate is within an orthographic projection of a surface of the lyophilic material layer away from the base substrate on the base substrate. The lyophilic material layer is made of a lyophilic material having attractability to a solution with organic electroluminescent materials dissolved, and the lyophobic material layer is made of a lyophobic material having repellency to the solution with organic electroluminescent materials dissolved. The pixel defining layer reduces the influence on the uniformity of the films.

20 Claims, 9 Drawing Sheets

(52) U.S. Cl.
CPC ...... *H01L 51/0004* (2013.01); *H01L 51/0005* (2013.01); *H01L 51/56* (2013.01); *H01L 2227/323* (2013.01)

(58) Field of Classification Search
CPC ... H01L 51/005; H01L 51/56; H01L 27/3295; H01L 2227/323; H01L 51/0005; H01L 2251/56

See application file for complete search history.

(56) References Cited

U.S. PATENT DOCUMENTS

| | | |
|---|---|---|
| 2013/0017752 A1 | 1/2013 | Kajitani |
| 2014/0027729 A1 | 1/2014 | So et al. |
| 2015/0028310 A1* | 1/2015 | Dai ................ H01L 27/3246 257/40 |
| 2016/0276615 A1* | 9/2016 | Kitabayashi ........ H01L 51/5265 |
| 2017/0005151 A1* | 1/2017 | Kim .................... H01L 27/3246 |
| 2017/0194385 A1* | 7/2017 | Jung ................... H01L 27/3206 |
| 2017/0278914 A1* | 9/2017 | Cui .................... H01L 27/3206 |
| 2018/0033842 A1* | 2/2018 | Bae ...................... H01L 27/156 |
| 2018/0108839 A1 | 4/2018 | Hao et al. |
| 2018/0138435 A1* | 5/2018 | Kim .................... H01L 51/5056 |
| 2018/0166510 A1* | 6/2018 | Lee .................... H01L 27/3218 |
| 2018/0182828 A1* | 6/2018 | Kim .................... H01L 27/3246 |

FOREIGN PATENT DOCUMENTS

| | | | |
|---|---|---|---|
| KR | 20170079336 A * | 7/2017 | |
| WO | WO-2012132862 A1 * | 10/2012 | ............. H05B 33/02 |

* cited by examiner

PIXEL DEFINING LAYER, DISPLAY SUBSTRATE AND MANUFACTURING METHOD THEREOF, AND DISPLAY APPARATUS

The present application claims priority to Chinese Patent Application No.: 201710889480.5 filed with the State Intellectual Property Office of P.R. China on Sep. 27, 2017 and titled "PIXEL DEFINING LAYER, DISPLAY SUBSTRATE AND MANUFACTURING METHOD THEREOF, AND DISPLAY APPARATUS", the contents of which are incorporated herein by reference.

TECHNICAL FIELD

The present disclosure relates to a pixel defining layer, a display substrate and manufacturing method thereof and a display apparatus.

BACKGROUND

An organic light-emitting diode (OLED) display panel includes an anode, a hole injection layer, a hole transporting layer, an organic material film layer, an electron transporting layer, an electron injection layer, a cathode and so on. The organic material film layer may be manufactured through an ink-jet printing technology. When the ink-jet printing technology is used to manufacture the organic material film layer, a pixel defining layer needs to be formed on a base substrate first, and then a solution dissolved with organic light-emitting materials is sprayed on the base substrate on which the pixel defining layer is formed, so as to form the organic material film layer. Here, the pixel defining layer is used to define a plurality of pixel regions on the base substrate.

SUMMARY

Embodiments of the present disclosure provide a pixel defining layer, a display substrate and manufacturing method thereof, and a display apparatus.

In a first aspect, there is provided a pixel defining layer. The pixel defining layer comprises: a lyophilic material layer disposed on a base substrate, and a lyophobic material layer disposed at a side of the lyophilic material layer away from the base substrate; an orthographic projection of a surface of the lyophobic material layer close to the base substrate on the base substrate is within an orthographic projection of a surface of the lyophilic material layer away from the base substrate on the base substrate; wherein, the lyophilic material layer is made of a lyophilic material having attractability to a solution with organic electroluminescent materials dissolved, and the lyophobic material layer is made of a lyophobic material having repellency to the solution with organic electroluminescent materials dissolved.

Optionally, the pixel defining layer is configured to define a plurality of pixel regions in an array on the base substrate, a non-overlapped area exists between the surface of the lyophilic material layer away from the base substrate and the surface of the lyophobic material layer close to the base substrate, and the non-overlapped area comprises a plurality of annular areas; each pixel region is surrounded by a corresponding one of the plurality of annular areas and each of the annular areas includes at least one first strip area along a first direction and at least one second strip area along a second direction, a total number of the first strip area and the second strip area is greater than 2, and a width of the strip area is negatively correlated with a length of the strip area among a plurality of strip areas included in each annular area.

Optionally, each of the annular areas is a parallelogram annular area enclosed by two first strip areas and two second strip areas; a length of the first strip area is greater than a length of the second strip area, and a width of the first strip area is smaller than a width of the second strip area.

Optionally, each of the pixel regions is configured to dispose a sub-pixel and the widths of the first strip areas in the annular areas corresponding to the sub-pixels of different colors are different, and/or the widths of the second strip areas in the annular areas corresponding to the sub-pixels of different colors are different.

Optionally, the plurality of pixel regions in an array comprises: a first pixel region, a second pixel region and a third pixel region, each of the pixel regions being configured to dispose a sub-pixel of one color; the width of the first strip area in the annular area corresponding to the first pixel region, the width of the first strip area in the annular area corresponding to the second pixel region and the width of the first strip area in the annular area corresponding to the third pixel region increase sequentially.

Optionally, the width of the second strip area in the annular area corresponding to the first pixel region, the width of the second strip area in the annular area corresponding to the second pixel region and the width of the second strip area in the annular area corresponding to the third pixel region increase sequentially.

Optionally, the pixel regions comprise: a first pixel region, a second pixel region and a third pixel region, each of the pixel regions being configured to dispose a sub-pixel of one color;

the width of the second strip area in the annular area corresponding to the first pixel region, the width of the second strip area in the annular area corresponding to the second pixel region and the width of the second strip area in the annular area corresponding to the third pixel region increase sequentially.

Optionally, the width of the first strip area in the annular area corresponding to the first pixel region, the width of the first strip area in the annular area corresponding to the second pixel region and the width of the first strip area in the annular area corresponding to the third pixel region are the same.

Optionally, the pixel defining layer is configured to define a plurality of pixel regions in an array on the base substrate. Each of the pixel regions is configured to dispose one sub-pixel and areas of the pixel regions corresponding to the sub-pixels of different colors are different.

Optionally, a first pixel region is configured to dispose a red sub-pixel, a second pixel region is configured to dispose a green sub-pixel and a third pixel region is configured to dispose a blue sub-pixel.

Optionally, a thickness of the lyophobic material layer is greater than a thickness of the lyophilic material layer, and a direction of the thickness is perpendicular to an interface between the lyophilic material layer and the lyophobic material layer.

Optionally, the pixel defining layer is configured to define a plurality of pixel regions in an array on the base substrate; a longitudinal section of the lyophilic material layer and a longitudinal section of lyophobic material layer are both trapezoidal, the longitudinal section is perpendicular to an interface between the lyophilic material layer and the lyophobic material layer, and a plane of the longitudinal section intersects with at least one pixel region.

Optionally, the lyophobic material includes: fluorinated polyimide, fluorinated polymethyl methacrylate or polysiloxane; and the lyophilic material includes: silicon dioxide or silicon nitride.

In a second aspect, there is provided a method for manufacturing a pixel defining layer, comprising: forming a lyophilic material layer with a lyophilic material on a base substrate, the lyophilic material having attractability to a solution with organic electroluminescent materials dissolved, and forming a lyophobic material layer with a lyophobic material at a side of the lyophilic material layer away from the base substrate, the lyophobic material having repellency to the solution with organic electroluminescent materials dissolved. Wherein, an orthographic projection of a surface of the lyophobic material layer close to the base substrate on the base substrate is within an orthographic projection of a surface of the lyophilic material layer away from the base substrate on the base substrate.

Optionally, forming the lyophilic material layer with the lyophilic material on the base substrate comprises: forming a lyophilic material thin film layer with the lyophilic material on the base substrate; and performing a patterning treatment on the lyophilic material thin film layer by a first mask plate to obtain the lyophilic material layer; and forming the lyophobic material layer with the lyophobic material at the side of the lyophilic material layer away from the base substrate comprises: forming a lyophobic material thin film layer with the lyophilic material at the side of the lyophilic material layer away from the base substrate; and performing a patterning treatment on the lyophobic material thin film layer by a second mask plate to obtain the lyophobic material layer. Wherein a size of a light transmission hole of the first mask plate is different from a size of a light transmission hole of the second mask plate.

Optionally, when photoresist used to perform the patterning treatment on the lyophobic material thin film layer and the lyophilic material thin film layer is negative photoresist, an orthographic projection of the light transmission hole of the second mask plate on the base substrate is within an orthographic projection of the light transmission hole of the first mask plate on the base substrate.

Optionally, when photoresist used to perform the patterning treatment on the lyophobic material thin film layer and the lyophilic material thin film layer is positive photoresist, an orthographic projection of the light transmission hole of the first mask plate on the base substrate is within an orthographic projection of the light transmission hole of the second mask plate on the base substrate.

In a third aspect, there is provided a display substrate, comprising: a base substrate, a pixel defining layer disposed on the base substrate and an organic light-emitting layer disposed in a pixel region defined by the pixel defining layer; the pixel defining layer comprises: a lyophilic material layer disposed on the base substrate, and a lyophobic material layer disposed at a side of the lyophilic material layer away from the base substrate. An orthographic projection of a surface of the lyophobic material layer close to the base substrate on the base substrate is within an orthographic projection of a surface of the lyophilic material layer away from the base substrate on the base substrate. Wherein, the lyophilic material layer is made of a lyophilic material having attractability to a solution with organic electroluminescent materials dissolved, and the lyophobic material layer is made of a lyophobic material having repellency to the solution with organic electroluminescent materials dissolved.

Optionally, the display substrate further comprises: an anode disposed between the base substrate and the pixel defining layer, and a cathode disposed at a side of the organic light-emitting layer away from the base substrate.

In a fourth aspect, there is provided a method for manufacturing a display substrate. The method comprises: forming a pixel defining layer on the base substrate with the method for manufacturing the pixel defining layer in the second aspect; and forming an organic light-emitting layer in the pixel region defined by the pixel defining layer through an ink-jet printing technology.

In a fifth aspect, there is provided a display apparatus. The apparatus comprises the display substrate in the third aspect.

DETAILED DESCRIPTION

Figure 1:
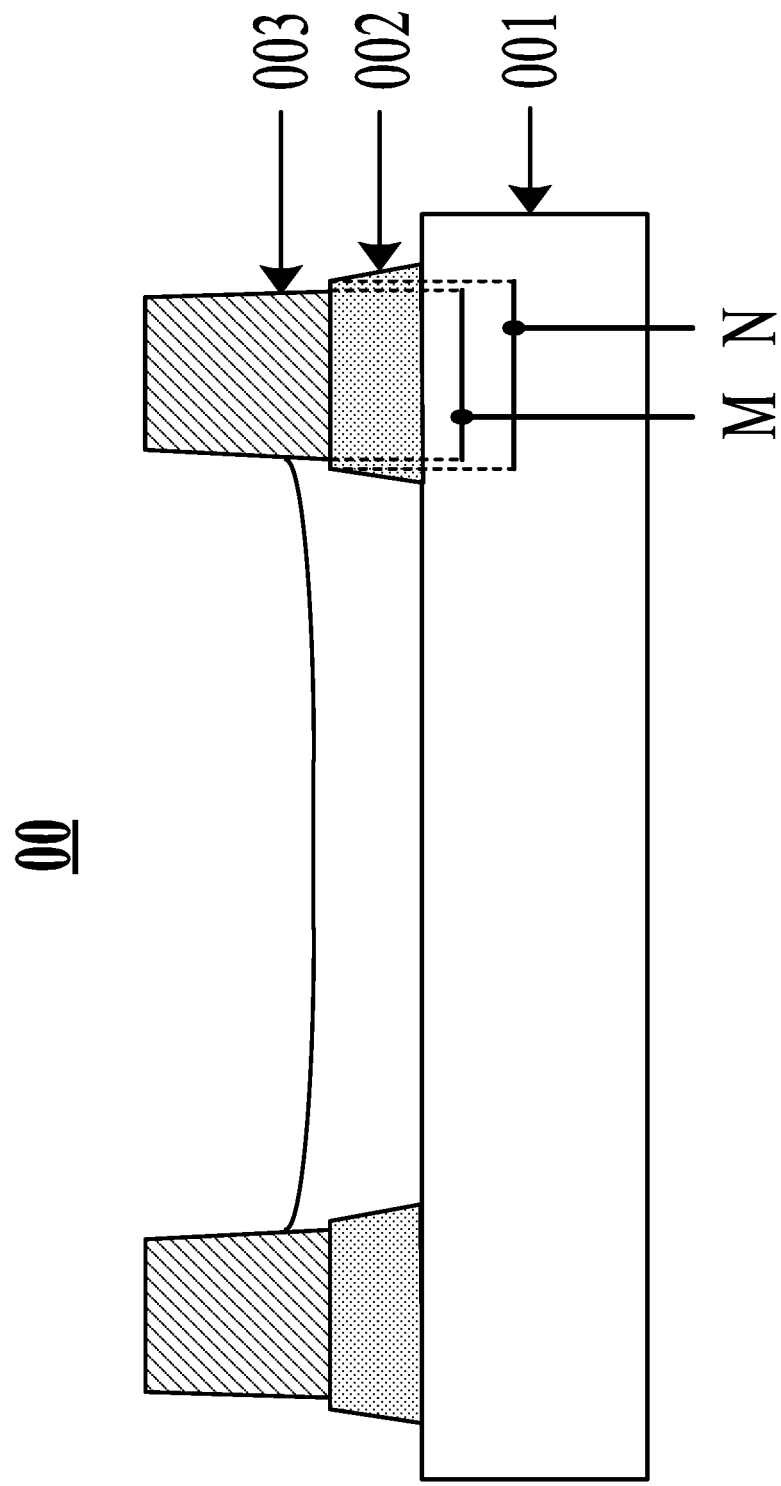
FIG. 1 is a schematic diagram of a structure of a pixel defining layer according to an embodiment of the present disclosure.

In order to make the principles and advantages of the present disclosure clearer, the embodiments of the present disclosure will be described in further detail with reference to the accompanying drawings.

An OLED display panel has advantages of self-illumination, fast response, wide viewing angle, high brightness, brilliant color, lightness, etc as compared with a liquid crystal display panel. The method for manufacturing the film layers in the OLED display panel mainly includes: vacuum evaporation, solution process and the like. Vacuum evaporation is more applicable to manufacture films made of organic micromolecule materials. The technology in vacuum evaporation is relatively mature and the films manufactured with this method have good uniformity. However, the investment on the equipment used to manufacture films with this method is high and the materials have a low utilization ratio. Moreover, when films of large-size products are manufactured with this method, the alignment precision is low. Solution process may include spin coating, ink-jet printing, nozzle coating and the like. Solution process is more applicable to manufacture films made of polymer materials and soluble micromolecules. With this method, the investment of the equipment is low and this method has outstanding advantages for manufacturing films of large-scale and large-size products. Especially, the ink-jet printing technology has obvious advantages. When a film is manufactured with the ink-jet printing technology, a pixel defining layer needs to be formed in advance on a base substrate on which an anode is formed. The pixel defining layer is configured to define a plurality of pixel regions in an array on the base substrate, and each of the pixel regions is configured to dispose one sub-pixel. The pixel defining layer may generate a certain acting force on the solution for ink-jet printing and the acting force may facilitate the solution to flow into the designated red (R)/green (G)/blue (B) sub-pixel region accurately.

Generally, the longitudinal section of the pixel defining layer is in the shape of an "upright" trapezoid, and the pixel defining layer is made of a lyophobic material. Here, the longitudinal section of the pixel defining layer is perpendicular to the interface between the pixel defining layer and the base substrate, and the longitudinal section intersects with at least one pixel region. As a surface energy difference exists in the contact area between the solution dissolved with an organic light-emitting material for ink-jet printing (For the convenience of description, hereinafter referred to as a solution) and the pixel defining layer, the side face of the pixel defining layer has a certain angle of inclination, and the solution has certain dry property, the solution may climb on the pixel defining layer. Thus, the phenomenon that the organic light-emitting layer formed after the solution dries is thin on the periphery and thick in the middle area may easily appear, which may lead to the non-uniform thickness of the film of the formed organic light-emitting layer. That is, the uniformity of the film formed by the solution in the pixel region is affected.

To solve this problem, there provides a pixel defining layer in an embodiment of the present disclosure. FIG. 1 shows a schematic diagram of a structure of the pixel defining layer. As shown in FIG. 1, the pixel defining layer 00 may include: a lyophilic material layer 002 disposed on a base substrate 001, and a lyophobic material layer 003 disposed at a side of the lyophilic material layer 002 away from the base substrate 001.

An orthographic projection M of the surface of the lyophobic material layer 003 close to the base substrate 001 on the base substrate 001 is within an orthographic projection N of the surface of the lyophilic material layer 002 away from the base substrate 001 on the base substrate 001.

Here, the lyophilic material layer 002 is made of a lyophilic material having attractability to a solution with organic electroluminescent materials dissolved, and the lyophobic material layer 003 is made of a lyophobic material having repellency to the solution with organic electroluminescent materials dissolved. Exemplarily, the lyophobic material may be any one of fluorinated polyimide, fluorinated polymethyl methacrylate or polysiloxane, and the lyophilic material may be silicon dioxide or silicon nitride.

In summary, an embodiment of the present disclosure provides a pixel defining layer. By arranging the orthographic projection of the surface of the lyophobic material layer close to the base substrate on the base substrate to be within the orthographic projection of the surface of the lyophilic material layer away from the base substrate on the base substrate, compared with the related art, the exposed lyophilic material layer in the contact area between the lyophilic material layer and the lyophobic material layer may have a stronger attracting function. During the ink-jet printing, the stronger attracting function may act on the solution that is in contact with the side face of the lyophobic material layer, such that the film formed by the solution under the action of the attracting function may be closer to the direction of the base substrate, so as to restrain the height to which the solution climbs on the side surface of the pixel defining layer. Thus, the influence on the uniformity of the film formed by the solution in the pixel region due to the climbing of the solution may be reduced.

It can be seen from FIG. 1 that both the longitudinal section of the lyophilic material layer 002 and the longitudinal section of the lyophobic material layer 003 may be in the shape of an "upright" trapezoid. The longitudinal section is perpendicular to the interface between the lyophilic material layer and the lyophobic material layer, and the plane of the longitudinal section intersects with at least one pixel region. When both the longitudinal section of the lyophilic material layer 002 and the longitudinal section of the lyophobic material layer 003 are in the shape of an "upright" trapezoid, a certain angle exists between the side face of the pixel defining layer and the base substrate. When a cathode is formed on the base substrate on which the pixel defining layer is formed, the side face having the certain angle may provide a buffer for the cathode, such that the cathode may be disposed along the side face of the pixel defining layer. Thus, the cathode may be prevented from cracking, thereby guaranteeing that the organic light-emitting layer formed in the pixel region may contact with the cathode effectively.

Exemplarily, the thickness of the lyophobic material layer 003 may be greater than the thickness of the lyophilic material layer 002. For example, the thickness of the lyophilic material layer 002 may be set to be smaller than 500 nm, and the sum of the thickness of the lyophilic material layer 002 and the thickness of the lyophobic material layer 003 may be set to be smaller than 3 μm. The lyophilic material layer has attractability to the solution, and the solution climbs to a higher height on the side face of the pixel defining layer when the lyophilic material layer is thicker. Therefore, the thickness of the lyophilic material layer need to be set smaller than the thickness of the lyophobic material layer, so as to restrain the solution from climbing on the side face of the pixel defining layer and effectively preventing the solution ink-jetted into the pixel region from flowing outside the region outside the pixel region through the repellency function of the lyophilic material layer on the solution.

Figure 2:
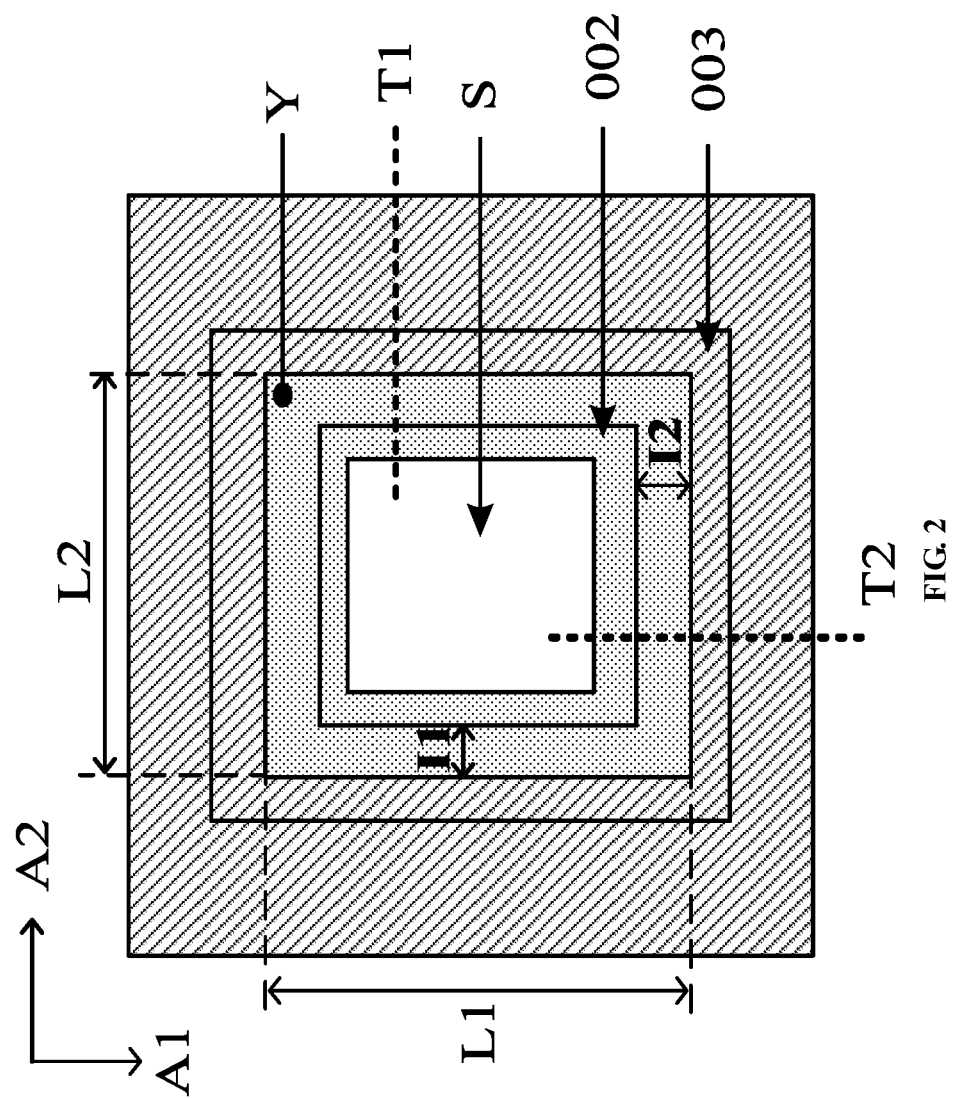
FIG. 2 is a top view of a portion of a pixel defining layer according to an embodiment of the present disclosure.

FIG. 2 is a top view of a portion of a pixel defining layer. As shown in FIG. 2, a non-overlapped area exists between the surface of the lyophilic material layer 002 away from the base substrate 001 and the surface of the lyophobic material layer 003 close to the base substrate 001, and the non-overlapped area comprises a plurality of annular areas Y. Each annular area Y surrounds the outside of one pixel region S and includes at least one first strip area along a first direction A1 and at least one second strip area along a second direction A2. Moreover, the total number of the first strip area and the second strip area is greater than 2. Among the plurality of strip areas included in each annular area Y, the width of the strip area is negatively correlated with the length of the strip area. That is, the smaller the length of the strip area is, the larger the width of the strip area is.

Optionally, the annular area may be in the shape of a rectangular shown in FIG. 2, and it may be in the shape of a triangle, a parallelogram or a hexagon or the like, which is not limited in the embodiments of the present disclosure.

Figure 3:
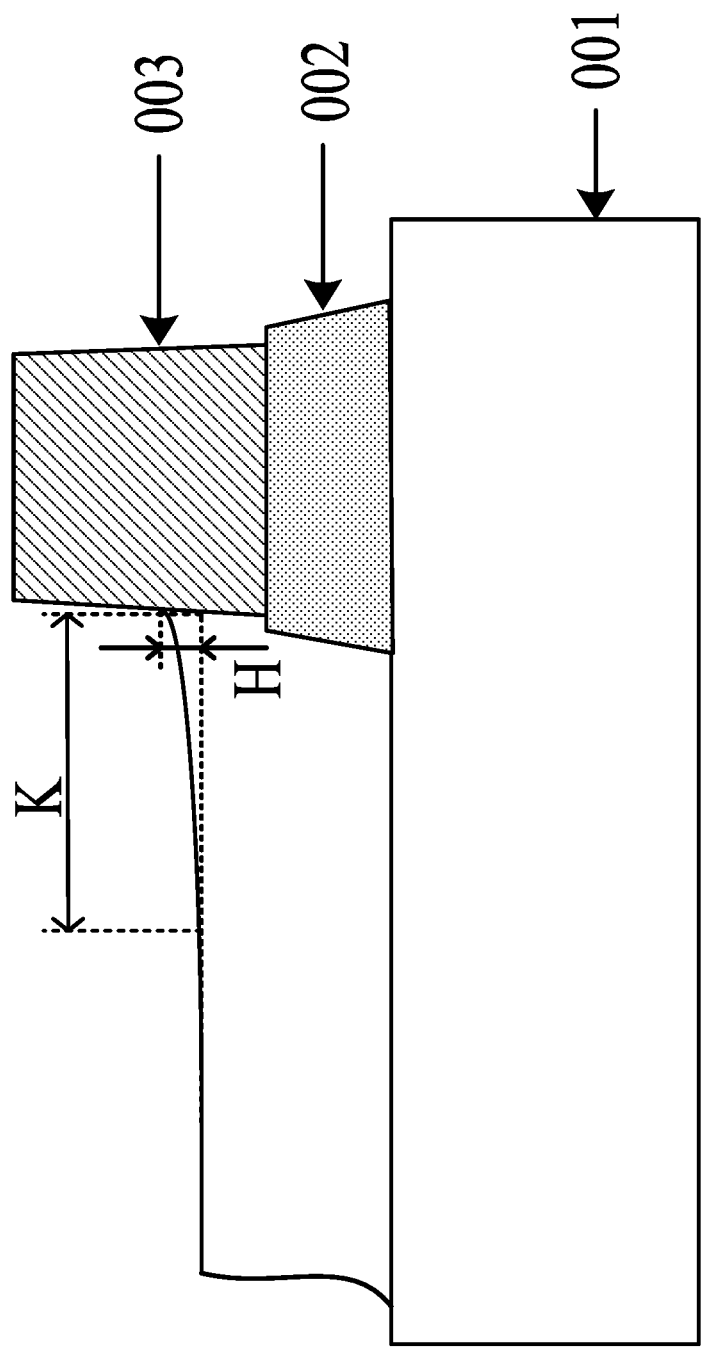
FIG. 3 is a schematic diagram of a structure of another pixel defining layer according to an embodiment of the present disclosure.

Due to the existence of the non-overlapped area, the contact area between the lyophilic material layer 002 and the solution increases. Thus, the solution close to the side face of the pixel defining layer may sufficiently contact with the lyophilic material layer 002, such that the lyophilic material layer 002 may play a full function of attracting the solution. Moreover, by limiting the length and width of the strip area in the non-overlapped area, the length of the strip area matches up with the length of the sub-pixel to be formed in the pixel region, so as to balance the acting forces of the pixel defining layer on the solutions at different positions that are in contact with the side face of the pixel defining layer. In this way, the films formed at various positions may present uniformity. That is, the heights (H as shown in FIG. 3) to which the solutions at various positions climb on the side face of the pixel defining layer are enabled to be the same as far as possible, and the widths (K as shown in FIG. 3) to which the solutions at various positions climb on the side face of the pixel defining layer are also enabled to be the same as far as possible, to further improve the uniformity of the films formed by the solutions in the pixel region.

Balancing the acting forces of the pixel defining layer on the solutions at different positions that are in contact with the side face of the pixel defining layer may be interpreted as: during the drying process of the spherical ink droplets that are ink-jetted into the pixel region, as the solution molecules spread constantly toward the periphery of the pixel region from the central position of the pixel region, generally, the solution fills the periphery of the pixel region at the same speed. When the ink droplets are far away from the periphery of the pixel region, it takes a long time to reach the periphery. When the ink droplets are close to the periphery of the pixel region, it takes a short time to reach the periphery. Moreover, as the lyophilic material layer in the pixel defining layer has an attracting function to the ink droplets, the attracting function may facilitate the ink droplets to spread toward the periphery of the pixel region. When the width of the exposed lyophilic material layer in the contact area between the lyophilic material layer and the lyophobic material layer is wider, the attracting function is stronger, and the ink droplets may spread toward the periphery of the pixel region at a fast speed. Therefore, when the width of the strip area with a large length (the ink droplet is far away from the strip area) is set to be large, the strip area with a large width has a stronger attracting function on the ink droplets. Under the stronger attracting function, the ink droplets may spread toward the strip area at a fast speed and the fast speed may compensate for the long time for the ink droplets to pass the long distance to reach the strip area at a normal speed, such that the amount of the ink droplets spreading to the periphery of the strip area with the short length and the amount of the ink droplets spreading to the periphery of the strip area with the long length within the same period of time are the same as far as possible. Thus, the width and the height to which the solution climbs on the side face of the pixel defining layer are the same as far as possible.

Figure 4:
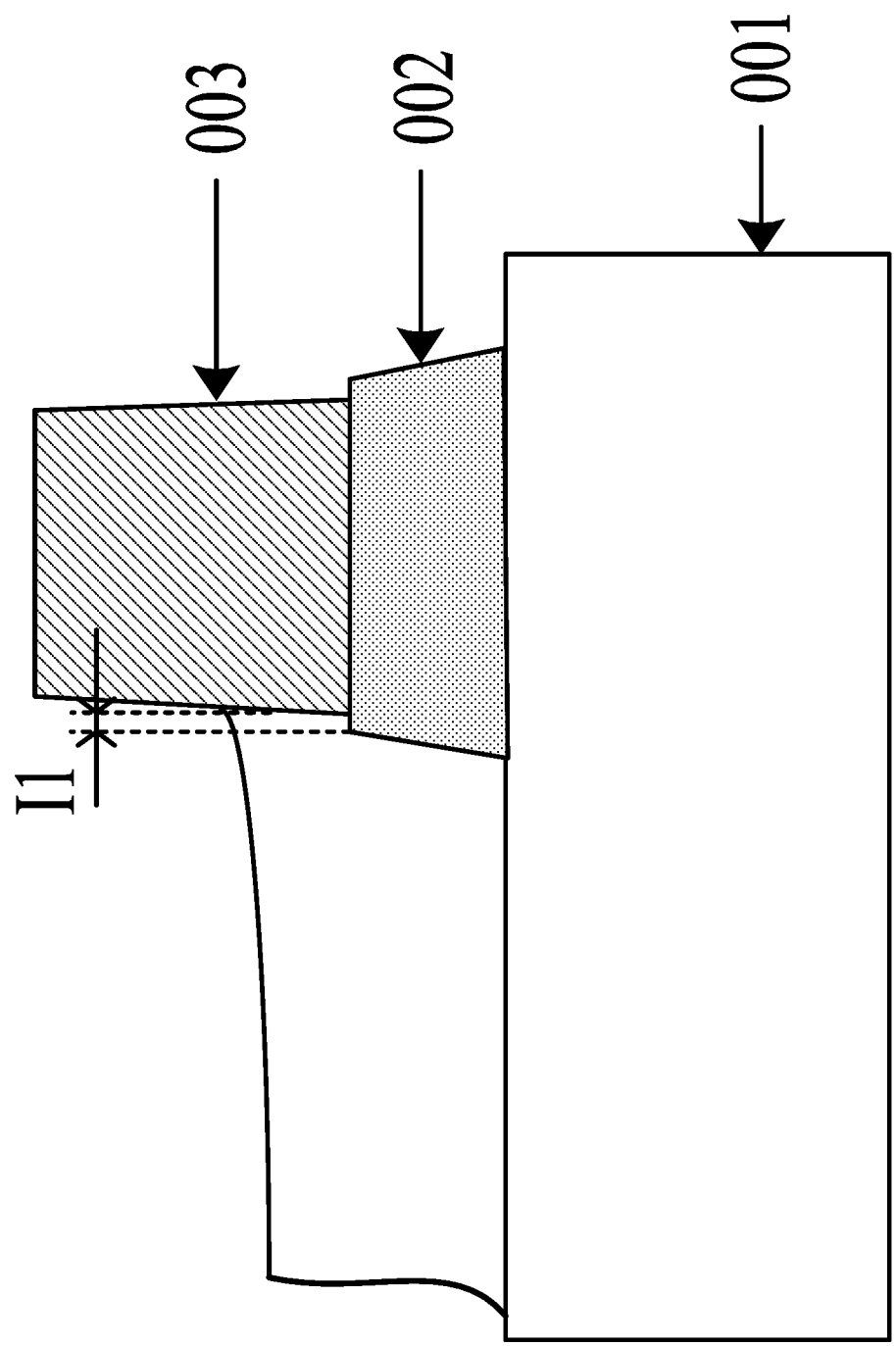
FIG. 4 is a diagram of a cross section of the pixel defining layer in FIG. 2 at position T1.
Figure 5:
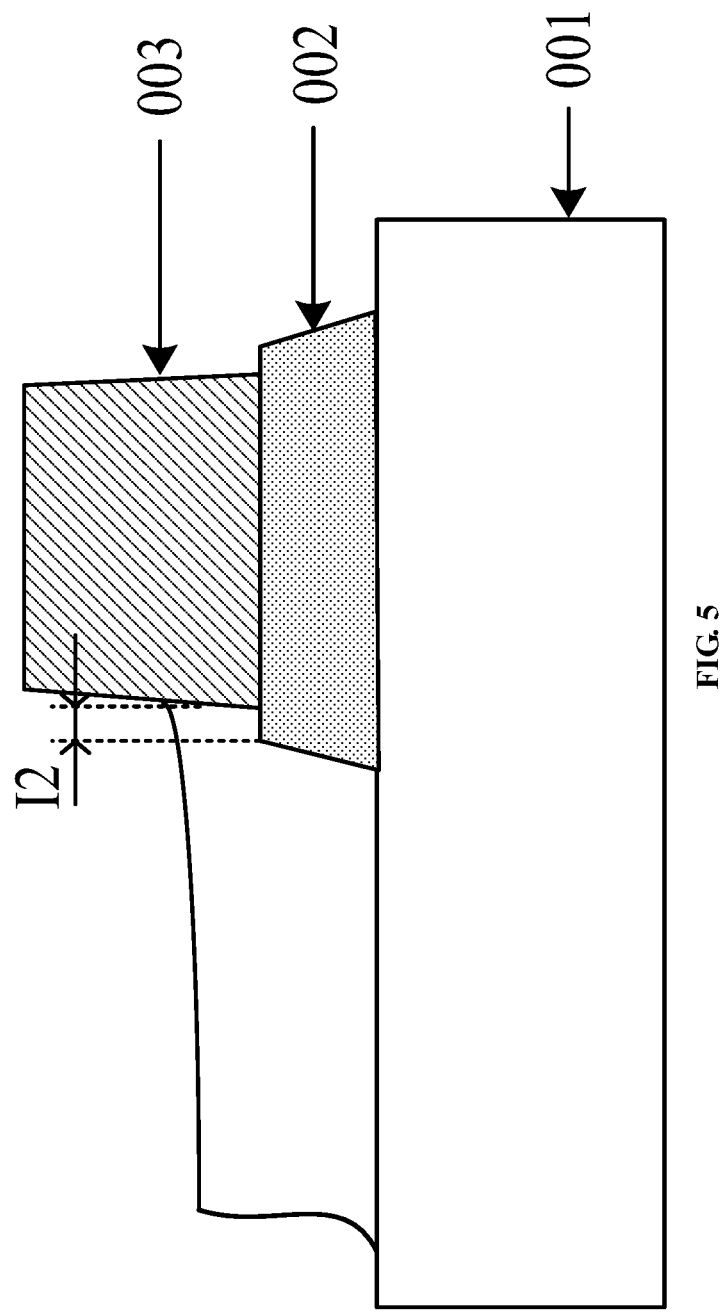
FIG. 5 is a diagram of a cross section of the pixel defining layer in FIG. 2 at position T2.

Exemplarily, please continue referring to FIG. 2, each annular area Y may be a parallelogram annular area Y (the rectangular annular area in FIG. 2) enclosed by two first strip areas and two second strip areas. In each annular area Y, the length L1 of the first strip area is greater than the length L2 of the second strip area, and the width of the first strip area I1 is smaller than the width 12 of the second strip area. Here, please refer to FIG. 4 and FIG. 5, FIG. 4 is a diagram of a cross section of the pixel defining layer in FIG. 2 at position T1. FIG. 4 shows a diagram of the width I1 of the first strip area in the cross section of the pixel defining layer. FIG. 5 is a diagram of a cross section of the pixel defining layer in FIG. 2 at position T2. FIG. 5 shows a diagram of the width 12 of the second strip area in the cross section of the pixel defining layer.

As the length L1 of the first strip area is greater than the length L2 of the second strip area, the time for the solution molecules to reach the periphery of the first strip area at a normal speed is less than the time to reach the periphery of the second strip area at a normal speed. However, as the width of the first strip area I1 is smaller than the width 12 of the second strip area, the attracting function of the first strip area on the solution molecules is weaker than the attracting function of the second strip area on the solution molecules. Under the stronger attracting function, the solution molecules may spread toward the periphery of the second strip area at a fast speed. Here, the fast speed may compensate for the long time for the ink droplets to pass the long distance to reach the strip area at a normal speed, such that the amount of the ink droplets spreading to the periphery of the first strip area and the amount of the ink droplets spreading to the periphery of the second strip area within the same period of time are the same as far as possible. Thus, the width and the height to which the solution climbs on the side face of the pixel defining layer are the same as far as possible.

Additionally, as the surface energy difference of the pixel defining layer and the surface energy difference of the materials forming the sub-pixels of different colors are different, the widths I1 of the first strip areas in the annular areas Y corresponding to the sub-pixels of different colors may also be different, and/or the widths 12 of the second strip areas in the annular areas Y corresponding to the sub-pixels of different colors may also be different. When the widths I1 of the first strip areas and/or the widths 12 of the second strip areas in the annular areas Y corresponding to the sub-pixels of different colors are set to be different, the acting forces on the pixel defining layer and the materials forming the sub-pixels of different colors may be adjusted according to the different surface energy differences of the pixel defining layer and the material forming the sub-pixels of different colors, such that the acting forces of the pixel defining layer on the materials of different colors may be in a balanced state. Thus, the heights H to which the solutions corresponding to the sub-pixels of different colors climb on the side face of the pixel defining layer are the same as far as possible and the widths K to which the solutions corresponding to the sub-pixels of different colors climb are also the same as far as possible, thereby further improving the uniformity of the films formed by the solutions in the pixel region.

Alternatively, the plurality of pixel regions in an array defined by the pixel defining layer may include: a first pixel region, a second pixel region and a third pixel region. Each pixel region is configured to dispose a sub-pixel of one color. It may be known from the property of the materials forming the sub-pixels of different colors that the life spans of the materials forming the sub-pixels of different colors are different. Moreover, in the case of the same light-emitting amount of the sub-pixels of different colors in various pixel regions, when the area of the sub-pixel of a color is larger, the light-emitting amount of the sub-pixel of the color per unit of area is smaller, and correspondingly, the current density in the sub-pixel is smaller. When the current density is smaller, the damage of the current on the sub-pixel when the current flows through the sub-pixel is smaller. Thus, the life span of the sub-pixel may increase. Therefore, the areas of the sub-pixels of different colors may be set according to the property of the materials forming the sub-pixels. That is, the sizes of the areas of the first pixel region, the second pixel region and the third pixel region may be set respectively, such that the life spans of the sub-pixels of multiple colors may be the same as far as possible to improve the service life of the display panel.

Exemplarily, when the first pixel region is configured to dispose a red sub-pixel, the second pixel region is configured to dispose a green sub-pixel, and the third pixel region is configured to dispose a blue sub-pixel, as the life spans of the materials for forming the red sub-pixel, the green sub-pixel and the blue sub-pixel decrease sequentially, the area of the red sub-pixel, the area of the green sub-pixel and the area of the blue sub-pixel may be set to increase sequentially to increase the service life of the display panel.

Furthermore, when the sizes of the areas of the first pixel region, the second pixel region and the third pixel region are set respectively, the amounts of the solutions ink-jetted into various pixel regions are different. For example, when the area of the first pixel region, the area of the second pixel region and the area of the third pixel region increase sequentially, the amount of the solution ink-jetted into the first pixel region, the amount of the solution ink-jetted into the second pixel region and the amount of the solution ink-jetted into the third pixel region increase sequentially. Here, by limiting the height and the width of the strip area in the non-overlapped area mentioned above, the width of the first strip area and the width of the second strip area in the annular area Y corresponding to each pixel region may be set respectively, such that the widths of the first strips in the annular areas Y corresponding to the sub-pixels of different colors are different, and/or the widths of the second strips in the annular areas Y corresponding to the sub-pixels of different colors are different. Thus, the acting forces of the pixel defining layer on the solutions at different positions that are in contact with the side face of the pixel defining layer may be balanced. In this way, the widths and the heights to which the solutions in various pixel regions climb on the side face of the pixel defining layer are the same as far as possible.

Optionally, the method for setting the width of the first strip area and the width of the second strip area in the annular area corresponding to each pixel region may at least include the following possible implementations.

In the first possible implementation, the width of the first strip area in the annular area corresponding to the first pixel region, the width of the first strip area in the annular area corresponding to the second pixel region and the width of the first strip area in the annular area corresponding to the third pixel region increase sequentially, and the width of the second strip area in the annular area corresponding to the first pixel region, the width of the second strip area in the annular area corresponding to the second pixel region and the width of the second strip area in the annular area corresponding to the third pixel region are the same.

In the second possible implementation, the width of the second strip area in the annular area corresponding to the first pixel region, the width of the second strip area in the annular area corresponding to the second pixel region and the width of the second strip area in the annular area corresponding to the third pixel region increase sequentially, and the width of the first strip area in the annular area corresponding to the first pixel region, the width of the first strip area in the annular area corresponding to the second pixel region and the width of the first strip area in the annular area corresponding to the third pixel region are the same.

In the third possible implementation, the width of the first strip area in the annular area corresponding to the first pixel region, the width of the first strip area in the annular area corresponding to the second pixel region and the width of the first strip area in the annular area corresponding to the third pixel region increase sequentially, and the width of the second strip area in the annular area corresponding to the first pixel region, the width of the second strip area in the annular area corresponding to the second pixel region and the width of the second strip area in the annular area corresponding to the third pixel region increase sequentially.

Figure 6:
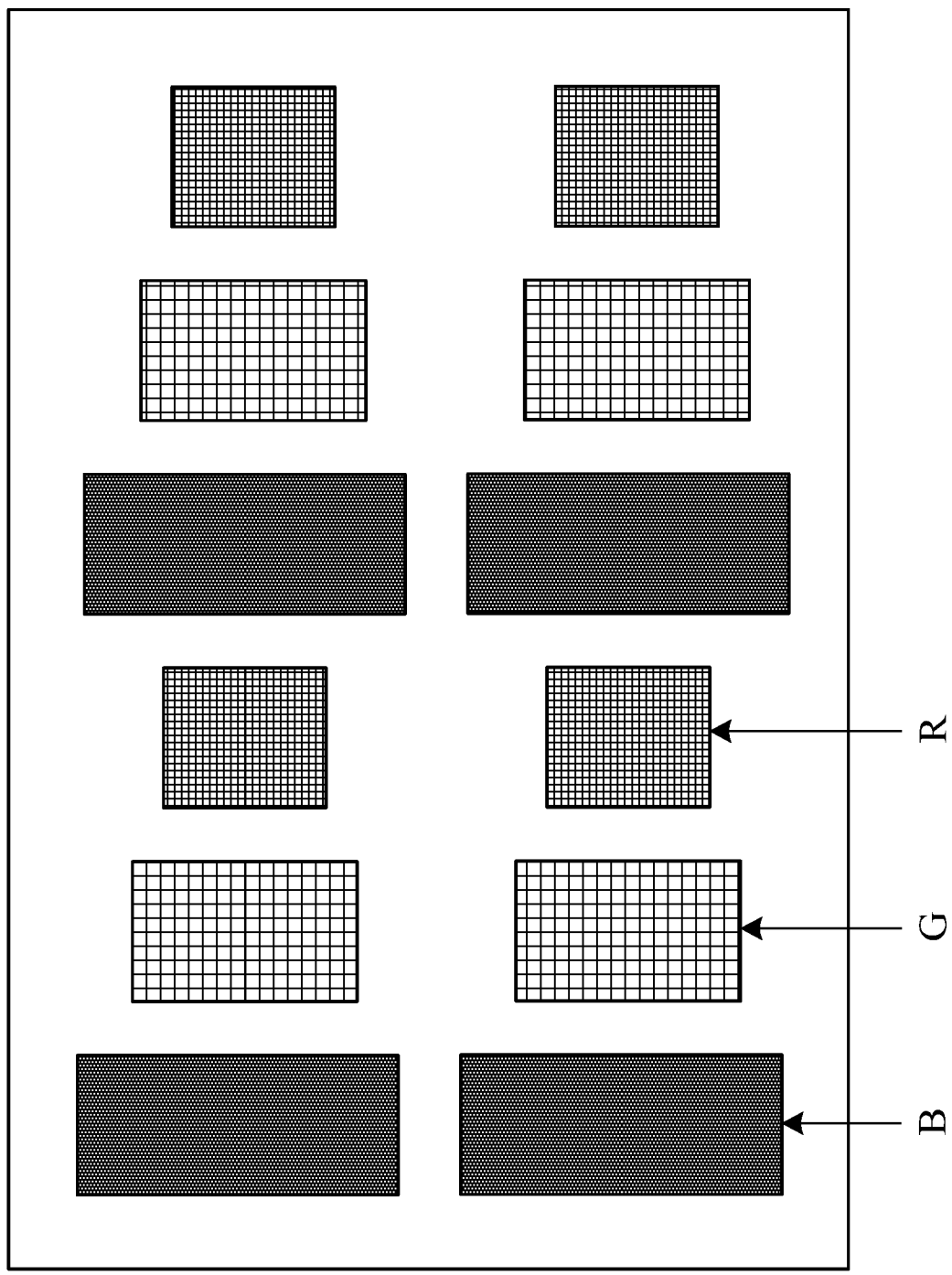
FIG. 6 is a diagram of shapes of a red sub-pixel, a green sub-pixel and a blue sub-pixel formed in a pixel region according to an embodiment of the present disclosure.

Exemplarily, when the first pixel region is configured to dispose a red sub-pixel, the second pixel region is configured to dispose a green sub-pixel and the third pixel region is configured to dispose a blue sub-pixel, the widths of the red sub-pixel, the green sub-pixel and the blue sub-pixel to be manufactured are the same, and the lengths of the red sub-pixel, the green sub-pixel and the blue sub-pixel increase sequentially, the width of the first strip area in the annular area corresponding to the first pixel region, the width of the first strip area in the annular area corresponding to the second pixel region and the width of the first strip area in the annular area corresponding to the third pixel region may be set to be the same, and the width of the second strip area in the annular area corresponding to the first pixel region, the width of the second strip area in the annular area corresponding to the second pixel region and the width of the second strip area in the annular area corresponding to the third pixel region may be set to increase sequentially. Here, the shapes of the red sub-pixel R, the green sub-pixel G and the blue sub-pixel B formed in the pixel region according to the pixel defining layer may be referred to FIG. 6.

Figure 7:
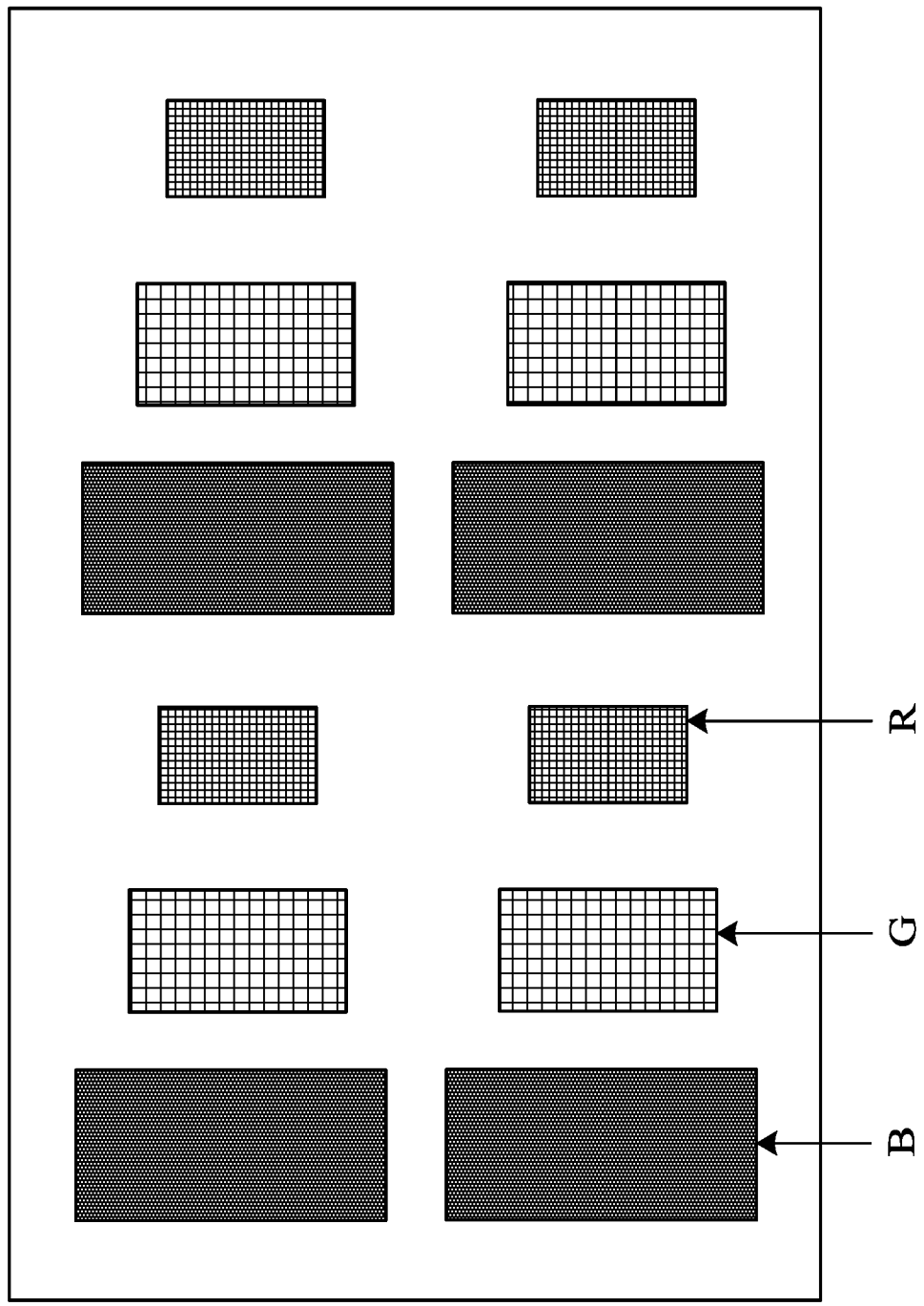
FIG. 7 is a diagram of shapes of another red sub-pixel, green sub-pixel and blue sub-pixel formed in a pixel region according to an embodiment of the present disclosure.

Exemplarily, when the first pixel region is configured to dispose a red sub-pixel, the second pixel region is configured to dispose a green sub-pixel and the third pixel region is configured to dispose a blue sub-pixel, the widths of the red sub-pixel, the green sub-pixel and the blue sub-pixel to be manufactured increase sequentially, and the lengths of the red sub-pixel, the green sub-pixel and the blue sub-pixel increase sequentially, the width of the first strip area in the annular area corresponding to the first pixel region, the width of the first strip area in the annular area corresponding to the second pixel region and the width of the first strip area in the annular area corresponding to the third pixel region may be set to increase sequentially, and the width of the second strip area in the annular area corresponding to the first pixel region, the width of the second strip area in the annular area corresponding to the second pixel region and the width of the second strip area in the annular area corresponding to the third pixel region may be set to increase sequentially. Here, the shapes of the red sub-pixel R, the green sub-pixel G and the blue sub-pixel B formed in the pixel region according to the pixel defining layer may be referred to FIG. 7.

In summary, an embodiment of the present disclosure provides a pixel defining layer. By arranging the orthographic projection of the surface of the lyophobic material layer close to the base substrate on the base substrate to be within the orthographic projection of the surface of the lyophilic material layer away from the base substrate on the base substrate, compared with the related art, the exposed lyophilic material layer in the contact area between the lyophilic material layer and the lyophobic material layer may have a stronger attracting function. During the ink-jet printing, the stronger attracting function may act on the solution that is in contact with the side face of the lyophobic material layer, such that the film formed by the solution under the action of the attracting function may be closer to the direction of the base substrate, thereby restraining the height to which the solution climbs on the side surface of the pixel defining layer. Thus, the influence on the uniformity of the film formed by the solution in the pixel region due to the climbing of the solution may be reduced. In addition, by controlling the height of the exposed lyophilic material layer corresponding to each pixel region, the heights and the widths to which the solutions in various pixel regions climb on the side face of the pixel defining layer may be the same as far as possible, thereby improving the uniformity of the films formed by the solutions in the pixel region.

Figure 8:
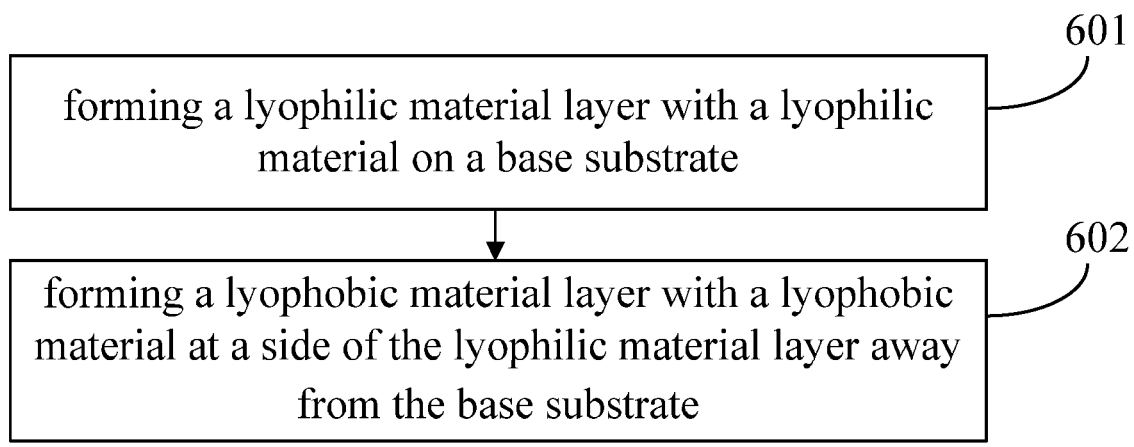
FIG. 8 is a flowchart of a method for manufacturing a pixel defining layer according to an embodiment of the present disclosure.

FIG. 8 shows a flowchart of a method for manufacturing a pixel defining layer according to an embodiment of the present disclosure. As shown in FIG. 8, the method may include the following processes.

In step 601, a lyophilic material layer is formed with a lyophilic material on a base substrate.

Here, the lyophilic material has attractability to a solution with organic electroluminescent materials dissolved.

In step 602, a lyophobic material layer is formed with a lyophobic material at a side of the lyophilic material layer away from the base substrate.

Here, the lyophobic material has repellency to the solution with organic electroluminescent materials dissolved. The orthographic projection of the surface of the lyophobic material layer close to the base substrate on the base substrate is within the orthographic projection of the surface of the lyophilic material layer away from the base substrate on the base substrate.

In summary, an embodiment of the present disclosure provides a method for manufacturing a pixel defining layer. By arranging the orthographic projection of the surface of the lyophobic material layer close to the base substrate on the base substrate to be within the orthographic projection of the surface of the lyophilic material layer away from the base substrate on the base substrate, compared with the related art, the exposed lyophilic material layer in the contact area between the lyophilic material layer and the lyophobic material layer may have a stronger attracting function. During the ink-jet printing, the stronger attracting function may act on the solution that is in contact with the side face of the lyophobic material layer, such that the film formed by the solution under the action of the attracting function may be closer to the direction of the base substrate, thereby restraining the height to which the solution climbs on the side surface of the pixel defining layer. Thus, the influence of the climbing of the solution on the uniformity of the film formed by the solution in the pixel region may be reduced.

Figure 9:
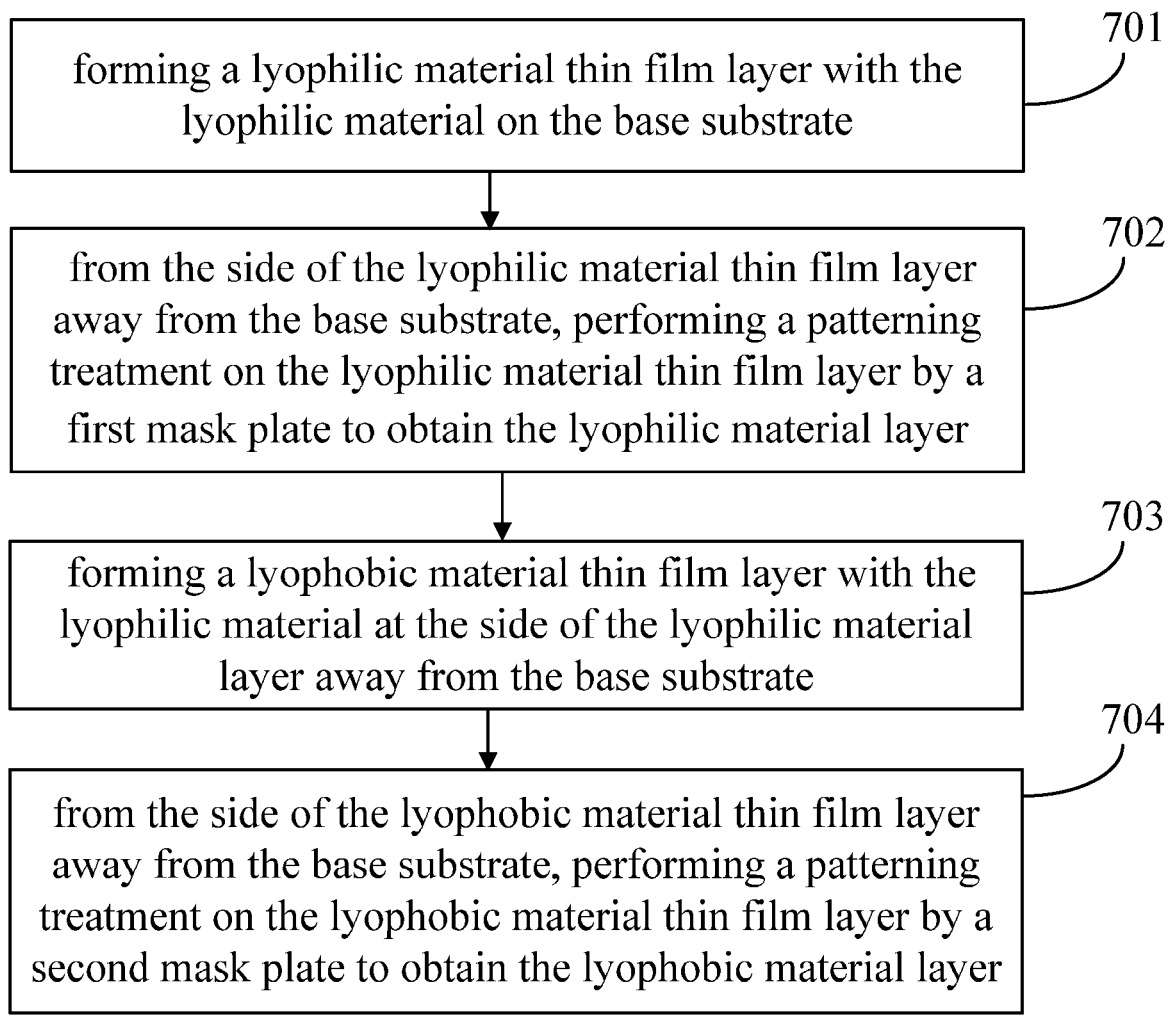
FIG. 9 is a flowchart of a method for manufacturing another pixel defining layer according to an embodiment of the present disclosure.

Optionally, as shown in FIG. 9, the method for manufacturing the pixel defining layer may include the following steps.

In step 701, a lyophilic material thin film layer is formed with the lyophilic material on the base substrate.

A layer of lyophilic material with a certain thickness may be deposited on the base substrate through magnetron sputtering, thermal evaporation, plasma enhanced chemical vapor deposition (PECVD) and the like, to obtain the lyophilic material thin film layer. Here, the lyophilic material is silicon dioxide or silicon nitride, and the value range of the thickness of the lyophilic material thin film layer may be set based on actual needs.

In step 702, from the side of the lyophilic material thin film layer away from the base substrate, a patterning treatment is performed on the lyophilic material thin film layer by a first mask plate to obtain the lyophilic material layer.

The lyophilic material layer with a certain pattern may be obtained by adopting a first mask plate to perform a patterning treatment on the lyophilic material thin film layer. Here, the patterning treatment may be implemented through a patterning process, which may include: photoresist coating, exposure, developing, etching and photoresist peeling.

In step 703, a lyophobic material thin film layer is formed with the lyophobic material at the side of the lyophilic material layer away from the base substrate.

Optionally, a layer of lyophobic material with a certain thickness may be coated on the side of the lyophobic material layer away from the base substrate to obtain the lyophobic material thin film layer. Here, the lyophobic material may be any one of fluorinated polyimide, fluorinated polymethyl methacrylate or polysiloxane, and the value range of the thickness of the lyophobic material thin film layer may be set based on actual needs.

In step 704, from the side of the lyophobic material thin film layer away from the base substrate, a patterning treatment is performed on the lyophobic material thin film layer by a second mask plate to obtain the lyophobic material layer.

As the lyophobic material may be a photoresist material, such as fluorinated polyimide, fluorinated polymethyl methacrylate or polysiloxane, the process of performing the patterning treatment on the lyophobic material thin film layer by a second mask plate may be: from the side of the lyophobic material thin film layer away from the base substrate, exposing on the lyophobic material thin film layer by a second mask plate, developing the exposed lyophobic material thin film layer, and baking the developed lyophobic material thin film layer to obtain the lyophobic material layer.

Here, the light transmission hole of the first mask plate is different from the light transmission hole of the second mask plate and the difference lies in that the size of the light transmission hole of the first mask plate is different from the size of the light transmission hole of the second mask plate. Specifically, the light transmission hole of the mask plate may be set according to the pattern formed after the patterning treatment and the type of the photoresist. Exemplarily, when the photoresist used to perform the patterning treatment on the lyophobic material thin film layer in step 704 and the photoresist used to perform the patterning treatment on the lyophilic material thin film layer in step 702 are negative photoresist, the orthographic projection of the light transmission hole of the second mask plate on the base substrate is within the orthographic projection of the light transmission hole of the first mask plate on the base substrate. Alternatively, when the photoresist used to perform the patterning treatment on the lyophobic material thin film layer in step 704 and the photoresist used to perform the patterning treatment on the lyophilic material thin film layer in step 702 are positive photoresist, the orthographic projection of the light transmission hole of the first mask plate on the base substrate is within the orthographic projection of the light transmission hole of the second mask plate on the base substrate.

In summary, an embodiment of the present disclosure provides a method for manufacturing a pixel defining layer. By arranging the orthographic projection of the surface of the lyophobic material layer close to the base substrate on the base substrate to be within the orthographic projection of the surface of the lyophilic material layer away from the base substrate on the base substrate, compared with the related art, the exposed lyophilic material layer in the contact area between the lyophilic material layer and the lyophobic material layer may have a stronger attracting function. During the ink-jet printing, the stronger attracting function may act on the solution that is in contact with the side face of the lyophobic material layer, such that the film formed by the solution under the action of the attracting function may be closer to the direction of the base substrate, thereby restraining the height to which the solution climbs on the side surface of the pixel defining layer. Thus, the influence of the climbing of the solution on the uniformity of the film formed by the solution in the pixel region may be reduced.

An embodiment of the present disclosure further provides a display substrate. The display substrate may include: a base substrate, a pixel defining layer disposed on the base substrate and an organic light-emitting layer disposed in a pixel region defined by the pixel defining layer. The pixel defining layer is the pixel defining layer shown in FIG. 1, FIG. 2, FIG. 3, FIG. 4 or FIG. 5.

Exemplarily, the display substrate may at least include: an anode disposed between the base substrate and the pixel defining layer, and a cathode disposed at a side of the organic light-emitting layer away from the base substrate.

Figure 10:
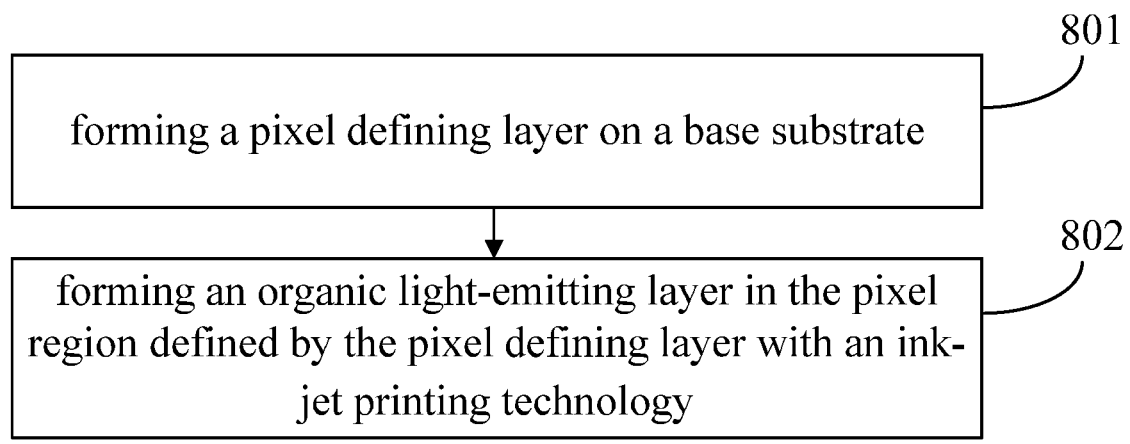
FIG. 10 is a flowchart of a method for manufacturing a display substrate according to an embodiment of the present disclosure.

FIG. 10 shows a method for manufacturing a display substrate according to an embodiment of the present disclosure. As shown in FIG. 10, the method may include the following processes.

In step 801, a pixel defining layer is formed on a base substrate.

Optionally, the pixel defining layer may be formed on the base substrate by the method for manufacturing the pixel defining layer shown in FIG. 8 or FIG. 9, which is not repeated here.

In step 802, an organic light-emitting layer is formed in the pixel region defined by the pixel defining layer with an ink-jet printing technology.

Exemplarily, the solution with organic electroluminescent materials dissolved may be sprayed on the pixel region and then the pixel region may be baked to obtain the organic light-emitting layer formed by the organic electroluminescent materials.

An embodiment of the present disclosure further provides a display panel. The display panel may include the display substrate in the above embodiment. The display panel may be a liquid crystal panel, an electronic paper, a mobile phone, a tablet computer, a TV, a display, a laptop computer, a digital photo frame, a navigator or any other product or part having a display function. Exemplarily, the display panel may be an OLED display panel.

An embodiment of the present disclosure further provides a display apparatus, including the display panel in the above embodiment.

It should be noted that the term "and/or" herein describes the correspondence of the corresponding objects, indicating three kinds of relationship. For example, A and/or B, can be expressed as: A exists alone, A and B exist concurrently, B exists alone. The character "/" generally indicates that the context object is an "OR" relationship.

The foregoing is only preferred embodiments of the present disclosure, and is not intended to limit the present disclosure. Within the spirit and principles of the disclosure, any modifications, equivalent substitutions, improvements, etc., are within the scope of protection of the present disclosure.

What is claimed is:

1. A pixel defining layer, comprising:
a lyophilic material layer disposed on a base substrate, and
a lyophobic material layer disposed at a side of the lyophilic material layer away from the base substrate; wherein
an orthographic projection of a surface of the lyophobic material layer close to the base substrate on the base substrate is within an orthographic projection of a surface of the lyophilic material layer away from the base substrate on the base substrate; and
the lyophilic material layer is made of a lyophilic material having attractability to solution with organic electroluminescent materials dissolved, and the lyophobic material layer is made of a lyophobic material having repellency to the solution with organic electroluminescent materials dissolved,
wherein the pixel defining layer is configured to define a plurality of pixel regions in an array on the base substrate, the plurality of pixel regions in an array comprises: a first pixel region used to dispose a red sub-pixel, a second pixel region used to dispose a green sub-pixel and a third pixel region used to dispose a blue sub-pixel; a non-overlapped area exists between the surface of the lyophilic material layer away from the base substrate and the surface of the lyophobic material layer close to the base substrate, and the non-overlapped area comprises a plurality of annular areas each is in a parallelogram shape;
wherein each pixel region is surrounded by a corresponding one of the plurality of annular areas and each of the annular areas includes two first strip areas along a first direction and two second strip areas along a second direction, a length of the first strip area being greater than a length of the second strip area and a width of the first strip area being smaller than a width of the second strip area, and
wherein the width of the first strip area in the annular area corresponding to the first pixel region, the width of the first strip area in the annular area corresponding to the second pixel region and the width of the first strip area in the annular area corresponding to the third pixel region increase sequentially.

2. The pixel defining layer according to claim 1, wherein the widths of the second strip areas in the annular areas corresponding to the sub-pixels of different colors are different.

3. The pixel defining layer according to claim 1, wherein the width of the second strip area in the annular area corresponding to the first pixel region, the width of the second strip area in the annular area corresponding to the second pixel region and the width of the second strip area in the annular area corresponding to the third pixel region increase sequentially.

4. The pixel defining layer according to claim 1, wherein areas of the pixel regions corresponding to the sub-pixels of different colors are different.

5. The pixel defining layer according to claim 1, wherein a thickness of the lyophobic material layer is greater than a thickness of the lyophilic material layer, and a direction of the thickness is perpendicular to an interface between the lyophilic material layer and the lyophobic material layer.

6. The pixel defining layer according to claim 1, wherein a longitudinal section of the lyophilic material layer and a longitudinal section of lyophobic material layer are both trapezoidal, the longitudinal section is perpendicular to an interface between the lyophilic material layer and the lyophobic material layer, and a plane of the longitudinal section intersects with at least one pixel region.

7. The pixel defining layer according to claim 1, wherein the lyophobic material includes: fluorinated polyimide, fluorinated polymethyl methacrylate and polysiloxane; and the lyophilic material includes: silicon dioxide and silicon nitride.

8. A display substrate, comprising a base substrate, a pixel defining layer disposed on the base substrate and an organic light-emitting layer disposed in a pixel region defined by the pixel defining layer;

wherein the pixel defining layer comprises:

a lyophilic material layer disposed on the base substrate, and a lyophobic material layer disposed at a side of the lyophilic material layer away from the base substrate;

an orthographic projection of a surface of the lyophobic material layer close to the base substrate on the base substrate is within an orthographic projection of a surface of the lyophilic material layer away from the base substrate on the base substrate;

wherein the lyophilic material layer is made of a lyophilic material having attractability to a solution with organic electroluminescent materials dissolved, and the lyophobic material layer is made of a lyophobic material having repellency to the solution with organic electroluminescent materials dissolved, wherein the pixel defining layer is configured to define a plurality of pixel regions in an array on the base substrate, the plurality of pixel regions in an array comprises: a first pixel region used to dispose a red sub-pixel, a second pixel region used to dispose a green sub-pixel and a third pixel region used to dispose a blue sub-pixel; a non-overlapped area exists between the surface of the lyophilic material layer away from the base substrate and the surface of the lyophobic material layer close to the base substrate, and the non-overlapped area comprises a plurality of annular areas each is in a parallelogram shape;

wherein each pixel region is surrounded by a corresponding one of the plurality of annular areas and each of the annular areas includes two first strip areas along a first direction and two second strip areas along a second direction, a length of the first strip area being greater than a length of the second strip area and a width of the first strip area being smaller than a width of the second strip area, and wherein the width of the first strip area in the annular area corresponding to the first pixel region, the width of the first strip area in the annular area corresponding to the second pixel region and the width of the first strip area in the annular area corresponding to the third pixel region increase sequentially.

9. The display substrate according to claim 8, further comprising: an anode disposed between the base substrate and the pixel defining layer, and a cathode disposed at a side of the organic light-emitting layer away from the base substrate.

10. A display apparatus, comprising the display substrate according to claim 8.

11. The display substrate according to claim 8, wherein the widths of the second strip areas in the annular areas corresponding to the sub-pixels of different colors are different.

12. The display substrate according to claim 8, wherein the width of the second strip area in the annular area corresponding to the first pixel region, the width of the second strip area in the annular area corresponding to the second pixel region and the width of the second strip area in the annular area corresponding to the third pixel region increase sequentially.

13. The display substrate according to claim 8, wherein areas of the pixel regions corresponding to the sub-pixels of different colors are different.

14. The display substrate according to claim 8, wherein a thickness of the lyophobic material layer is greater than a thickness of the lyophilic material layer, and a direction of the thickness is perpendicular to an interface between the lyophilic material layer and the lyophobic material layer.

15. The display substrate according to claim 8, wherein a longitudinal section of the lyophilic material layer and a longitudinal section of lyophobic material layer are both trapezoidal, the longitudinal section is perpendicular to an interface between the lyophilic material layer and the lyophobic material layer, and a plane of the longitudinal section intersects with at least one pixel region.

16. The display substrate according to claim 8, wherein the lyophobic material includes: fluorinated polyimide, fluorinated polymethyl methacrylate and polysiloxane; and the lyophilic material includes: silicon dioxide and silicon nitride.

17. A method for manufacturing a pixel defining layer, comprising:

forming a lyophilic material layer with a lyophilic material on a base substrate, the lyophilic material having attractability to a solution with organic electroluminescent materials dissolved, and forming a lyophobic material layer with a lyophobic material at a side of the lyophilic material layer away from the base substrate, the lyophobic material having repellency to the solution with organic electroluminescent materials dissolved;

wherein an orthographic projection of a surface of the lyophobic material layer close to the base substrate on the base substrate is within an orthographic projection of a surface of the lyophilic material layer away from the base substrate on the base substrate, wherein the pixel defining layer is configured to define a plurality of pixel regions in an array on the base substrate, the plurality of pixel regions in an array comprises: a first pixel region used to dispose a red sub-pixel, a second pixel region used to dispose a green sub-pixel and a third pixel region used to dispose a blue sub-pixel; a non-overlapped area exists between the surface of the lyophilic material layer away from the base substrate and the surface of the lyophobic material layer close to the base substrate, and the non-overlapped area comprises a plurality of annular areas each is in a parallelogram shape;

wherein each pixel region is surrounded by a corresponding one of the plurality of annular areas and each of the annular areas includes two first strip areas along a first direction and two second strip areas along a second direction, a length of the first strip area being greater than a length of the second strip area and a width of the first strip area being smaller than a width of the second strip area, and wherein the width of the first strip area in the annular area corresponding to the first pixel region, the width of the first strip area in the annular area corresponding to the second pixel region and the width of the first strip area in the annular area corresponding to the third pixel region increase sequentially.

18. The method according to claim 17, wherein
forming the lyophilic material layer with the lyophilic material on the base substrate comprises:
forming a lyophilic material thin film layer with the lyophilic material on the base substrate; and
performing a patterning treatment on the lyophilic material thin film layer by a first mask plate to obtain the lyophilic material layer; and
forming the lyophobic material layer with the lyophobic material at the side of the lyophilic material layer away from the base substrate comprises:
forming a lyophobic material thin film layer with the lyophilic material at the side of the lyophilic material layer away from the base substrate; and
performing a patterning treatment on the lyophobic material thin film layer by a second mask plate to obtain the lyophobic material layer;
wherein a size of a light transmission hole of the first mask plate is different from a size of a light transmission hole of the second mask plate.

19. The method according to claim 18, wherein
when photoresist used to perform the patterning treatment on the lyophobic material thin film layer and the lyophilic material thin film layer is negative photoresist, an orthographic projection of the light transmission hole of the second mask plate on the base substrate is located within an orthographic projection of the light transmission hole of the first mask plate on the base substrate.

20. The method according to claim 18, wherein
when photoresist used to perform the patterning treatment on the lyophobic material thin film layer and the lyophilic material thin film layer is positive photoresist, an orthographic projection of the light transmission hole of the first mask plate on the base substrate is located within an orthographic projection of the light transmission hole of the second mask plate on the base substrate.

* * * * *